United States Patent

Sakamoto

[11] Patent Number: 5,908,881
[45] Date of Patent: Jun. 1, 1999

[54] HEAT-CONDUCTIVE PASTE

[75] Inventor: Yushi Sakamoto, Utsunomiya, Japan

[73] Assignee: Sumitomo Bakelite Company Limited, Tokyo, Japan

[21] Appl. No.: 08/965,407

[22] Filed: Nov. 6, 1997

[30] Foreign Application Priority Data

Nov. 29, 1996 [JP] Japan .................................. 8-320554

[51] Int. Cl.$^6$ ...................................................... C08K 3/08
[52] U.S. Cl. .......................... 523/442; 252/514; 523/458
[58] Field of Search ..................................... 523/442, 458; 252/514

[56] References Cited

U.S. PATENT DOCUMENTS

| | | | |
|---|---|---|---|
| 4,450,471 | 5/1984 | Wellhoefer et al. . | |
| 4,732,702 | 3/1988 | Yamazaki | 523/457 |
| 5,180,523 | 1/1993 | Durand | 252/512 |
| 5,183,592 | 2/1993 | Ichimura | 523/458 |
| 5,575,956 | 11/1996 | Hermansen | 252/514 |

FOREIGN PATENT DOCUMENTS

| | | |
|---|---|---|
| 0428165A | 5/1991 | European Pat. Off. . |
| 0439171A | 7/1991 | European Pat. Off. . |
| 0501734A | 9/1992 | European Pat. Off. . |
| 07179833A | 7/1995 | Japan . |

OTHER PUBLICATIONS

Database WPI, , Week 9539, Derwent Publication Ltd., London, GB, AN 295079, XP002072647 "electric conducting resin paste comprise silver powder polyepoxide resin compound contain phenolic hydroxy group" (abstract) & JP 07179833 A.

Primary Examiner—Paul R. Michl
Attorney, Agent, or Firm—Beveridge, DeGrandi, Weilacher & Young LLP

[57] ABSTRACT

The object of the present invention is to provide a paste for bonding a semiconductor, which has excellent low stress and excellent heat conductivity and is useful industrially. The object has been achieved by a heat-conductive paste comprising (A) an epoxy resin which is liquid at room temperature and which has at least two epoxy groups in the molecule, (B) an epoxy group-containing reactive diluent having a viscosity of 100 cp or less at room temperature, (C) a phenolic compound as a curing agent represented by the following general formula (1), which is crystalline at room temperature:

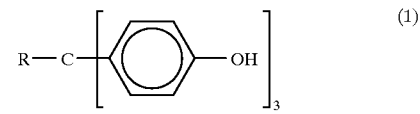

wherein R is hydrogen atom or an alkyl group of 1–5 carbon atoms, and (D) a silver powder, wherein the amount of the silver powder (D) is 70–90% by weight of the total paste; the silver powder (D) contains an atomized silver powder consisting of flake-shaped particles having longitudinal lengths ranging from $10\mu$ to $50\mu$ and thicknesses ranging from $1\mu$ to $5\mu$, in an amount of at least 30% by weight of the total silver powder; and the paste is produced by first melt-mixing the component (C) with the components (A) and (B) or with the component (B), and then kneading the resulting mixture with the component (D) or with the components (D) and (A).

7 Claims, No Drawings

HEAT-CONDUCTIVE PASTE

The present invention relates to a paste used for bonding a semiconductor, which has excellent low stress, adhesion and heat conductivity.

In recent years, semiconductor chips have become larger and semiconductor packages have become thinner. In this connection, the reliability requirement for the resin materials used therein is becoming increasingly severe year by year, and the properties of the paste used for bonding a semiconductor chip to a lead frame are becoming increasingly important because the properties influence the reliability of the package.

With respect to the reliability of the package, particularly important is solder cracking resistance when the package undergoes heat stress during mounting. In order to obtain high solder cracking resistance, not only the sealing material for a semiconductor but also the paste must have low stress, low water absorption and high adhesion. These properties were found out to be satisfied by a paste using a combination of a liquid epoxy resin, a compound having three phenolic hydroxyl groups in the molecule and a silver powder, as disclosed in Japanese Patent Application Laid-Open No. 179833/1995.

Since semiconductors have recently come to generate more heat during operation, the paste used therein is required to have high heat conductivity for dissipation of generated heat. In order to allow the paste disclosed in the above literature to have higher heat conductivity, the silver powder must be used in a large amount; this invites increase in paste viscosity and reduced coatability of paste; therefore, a solution for these problems has been necessary.

Further, the compound having three phenolic hydroxyl groups in the molecule consists of high-melting crystals; is dispersed in the paste as a solid; even after the curing of the paste, remains unreacted partially; and this state is seen even when the curing temperature is higher than the melting point of the compound. The presence of such a heat-insulating layer is presumed to give a cured paste of lower heat conductivity and a solution for this problem has also been necessary.

The present inventors made a study in order to develop a paste which retains the properties of the above-mentioned paste and yet which has high heat conductivity. As a result, the present invention has been completed.

According to the present invention, there is provided a heat-conductive paste comprising (A) an epoxy resin which is liquid at room temperature and which has at least two epoxy groups in the molecule, (B) an epoxy group-containing reactive diluent having a viscosity of 100 cp or less at room temperature, (C) a phenolic compound as a curing agent represented by the following general formula (1), which is crystalline at room temperature:

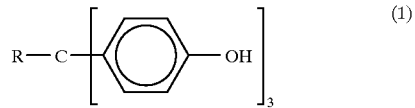

(1)

wherein R is hydrogen atom or an alkyl group of 1–5 carbon atoms, and (D) a silver powder, wherein the amount of the silver powder (D) is 70–90% by weight of the total paste; the silver powder (D) contains an atomized silver powder consisting of flake-shaped particles having longitudinal lengths ranging from $10\mu$ to $50\mu$ and thicknesses ranging from $1\mu$ to $5\mu$, in an amount of at least 30% by weight of the total silver powder; and the paste is produced by first melt-mixing the component (C) with the components (A) and (B) or with the component (B), and then kneading the resulting mixture with the component (D) or with the components (D) and (A).

The epoxy resin (A) used in the present invention must be liquid at room temperature. An epoxy resin which is solid at room temperature, is not preferred because a solvent and/or a reactive diluent is required in a large amount to fluidize the epoxy resin and this invites reduction in properties (e.g. adhesion and heat conductivity) of cured paste. However, mixed use of a liquid resin and a solid resin is permitted as long as the mixed resin is liquid. Examples of the component (A) include a diglycidyl ether which is obtained by the reaction of bisphenol A, bisphenol F or phenol novolac with epichlorohydrin and which is liquid at room temperature; and an alicyclic epoxy such as vinylcyclohexene dioxide, dicyclopentadiene oxide or alicyclic diepoxide-adipate.

The reactive diluent (B) must have a viscosity of 100 cp or less at room temperature so as to exhibit effective dilution. A viscosity higher than that gives a reduced dilution effect. The viscosity is measured using, for example, an Ubbelohde's viscometer.

Examples of the component (B) are styrene oxide, ethylhexyl glycidyl ether, phenyl glycidyl ether, credyl glycidyl ether and butylphenyl glycidyl ether. These compounds can be used singly or in admixture of two or more compounds.

The room temperature-crystalline phenolic compound (C) represented by the general formula (1), used in the present invention is contained in the paste in an amount of 0.1–20% by weight of the total paste. When the amount is less than 0.1% by weight, the resulting paste is unable to have sufficient low stress or low water absorption. When the amount is more than 20% by weight, the resulting paste have an increased viscosity, and the phenolic hydroxyl groups remain even after the curing of paste, inviting increased water absorption. Other curing agents may be used in addition to the component (C) as long as the properties of the paste are not impaired. Examples of such curing agents are an acid anhydride such as hexahydrophthalic acid anhydride, methylhydrophthalic acid anhydride, nadic acid anhydride or the like; a polyphenol such as novolac type phenolic resin or the like; and an amine compound such as imidazole, dicyandiamide or the like.

The silver powder (D) used as a main component in the present paste contains 30% by weight or more, based on the total silver powder, of an atomized silver powder consisting of flake-shaped particles having longitudinal lengths ranging from $10\mu$ to $50\mu$ and thicknesses ranging from $1\mu$ to $5\mu$. When the longitudinal lengths of the flake-shaped particles of the atomized silver powder are larger than $50\mu$, the resulting paste has low coatability and causes needle plugging during dispensation. When the longitudinal lengths are smaller than $10\mu$, the resulting paste shows no improvement in heat conductivity. When the thicknesses are larger than $5\mu$, the resulting paste has a problem in coating; when the thicknesses are smaller than $1\mu$, the resulting paste shows no improvement in heat conductivity. The atomized silver powder consisting of flake-shaped particles can be obtained by injecting molten silver at a high pressure to form coarse silver particles and then processing them into flake-shaped particles by use of a ball mill or the like. The silver powder used in a paste for a semiconductor is generally a reduced silver powder obtained, for example, by reducing silver nitrate chemically to obtain coarse silver particles and then processing them into flake-shaped particles by use of a ball mill or the like, and generally consists of finer flakes. With such a reduced silver powder, it is unable to obtain a paste of the present invention containing the silver powder having the above-mentioned particle size distribution. The atomized silver powder must be contained in the silver powder (D) in an amount of 30% by weight or more. When the amount is less than 30% by weight, the use of the atomized silver powder has no effect on improvement of heat conductivity. There is no particular restriction as to the particle shape of the silver powder other than the atomized silver powder, but the other silver powder preferably has a particle size distribution smaller than that of the atomized silver powder.

The amount of the total silver powder added is required to be 70–90% by weight of the total paste. When the amount is smaller than 70% by weight, no sufficiently high heat conductivity is obtained. When the amount is more than 90% by weight, the resulting paste has too high a viscosity which has no practical applicability.

The total proportion of the components (A) and (B) in the total paste is the remainder of the paste which is obtained by taking the total proportion of the components (C) and (D) from the total paste. The weight ratio of (A)/(B) is preferably 80/20 to 50/50. When the ratio is higher than 80/20, the viscosity of the resulting paste becomes too high, which causes problem in operability. When the ratio is lower than 50/50, the amount of the reactive diluent (B) which volatilizes during the curing thereof increases, which contaminates lead frame, chip surface or the like, which then causes interfacial release of an encapsulating resin after the molding thereof.

In the present invention, in order to obtain even higher heat conductivity, a special method for production of the paste is employed, whereby is solved the problem that the compound having three phenolic hydroxyl groups in the molecule, represented by the general formula (1) remains unreacted partially even after the curing of the paste. That is, first, the epoxy resin (A), the reactive diluent (B) and the compound (C) represented by the general formula (1), or the reactive diluent (B) and the compound (C) represented by the general formula (1) are melt-mixed; then, the resulting melt mixture is kneaded with the silver powder (D) or with the silver powder (D) and the epoxy resin (A), together with optional additives such as curing accelerator, anti-foaming agent, coupling agent and the like, by use of a roll or the like. The melt mixing is conducted preferably at 200° C. or below. When the melt mixing is conducted at a temperature higher than 200° C., local reaction between epoxy group and phenolic group takes place considerably, inviting viscosity increase. Thus, by first conducting melt mixing to dissolve the compound (C) which is a curing agent, there occurs no precipitation of the curing agent even during refrigeration storage of the paste. By producing a paste using the melt mixture in which the curing agent is dissolved, there is no mass of unreacted curing agent even after curing of the paste, and significantly improved heat conductivity is obtained.

In the present paste, by adding a silver powder of particular shape, the directionality of heat conduction is reduced and improved heat conductivity is obtained as compared with the case using a conventional silver powder consisting of flake-shaped particles. Further, by first dissolving the curing agent, i.e. the compound represented by the general formula (1), there remains no unreacted curing agent after the curing of the paste and even higher heat conductivity is obtained. As a result, there can be obtained a paste for bonding a semiconductor, which retains the properties of the curing agent represented by the general formula (1) and yet which has excellent heat conductivity.

The present invention is hereinafter described specifically by way of Examples and Comparative Examples.

Melt mixture 1

The following materials were mixed with stirring, in a volumetric flask at 170° C. according to the compounding recipe shown in Table 1.

Bisphenol A epoxy resin (epoxy equivalent=180, liquid at room temperature, hereinafter referred to as epoxy resin A)

t-Butylphenyl glycidyl ether (room temperature viscosity by Ubbelohde's viscometer=16 cp, hereinafter referred to as BPGE)

1,1,1,-Tris(p-hydroxyphenyl)ethane (hereinafter referred to as THPE)

One hour later, there was obtained a mixture wherein THPE was completely dissolved. This mixture is referred to as melt mixture 1.

Melt mixture 2

Epoxy resin A, BPGE, THPE and bisphenol F as another curing agent were mixed with stirring under the same conditions as in production of the melt mixture 1, according to the compounding recipe shown in Table 1, whereby a uniform mixture was obtained. This mixture is referred to as melt mixture 2.

Melt mixture 3

BPGE, THPE and bisphenol F were mixed with stirring under the same conditions as in production of the melt mixture 1, according to the compounding recipe shown in Table 1, whereby a uniform mixture was obtained. This mixture is referred to as melt mixture 3.

TABLE 1

|  | Melt mixtures | | |
| --- | --- | --- | --- |
|  | 1 | 2 | 3 |
| Epoxy resin A (wt. parts) | 65 | 65 |  |
| BPGE (wt. parts) | 35 | 35 | 35 |
| THPE (wt. parts) | 20 | 10 | 10 |
| Bisphenol F (wt. parts) |  | 10 | 10 |

EXAMPLES 1–5 AND COMPARATIVE EXAMPLES 1–5

There were mixed the above-mentioned melt mixtures 1–3, the following silver powders, the following other curing agent, the following curing accelerator and the following coupling agent, according to the compounding recipe shown in Table 2 or 3.

Atomized silver powder (hereinafter referred to as silver powder A) consisting of particles having longitudinal lengths ranging from $10\mu$ to $40\mu$ and thicknesses ranging from $2\mu$ to $5\mu$.

Reduced silver powder (hereinafter referred to as silver powder B) consisting of particles having longitudinal lengths ranging from $1\mu$ to $30\mu$ and thicknesses of $2\mu$ or less.

Reduced silver powder (hereinafter referred to as silver powder C) consisting of particles having longitudinal lengths ranging from $1\mu$ to $30\mu$ and thicknesses of $1\mu$ or less.

Dicyandiamide as another curing agent.

2-Phenyl-4-methylimidazole (2P4MI) as a curing accelerator.

Epoxysilane(γ-glycidoxypropyltrimethoxysilane) as a coupling agent.

Each of the resulting mixtures was kneaded using a triple roll mill to obtain a paste. The paste was placed in a vacuum chamber at 2 mmHg for 30 minutes for defoaming. The resulting paste was measured for its properties according to the following methods. The measurement results are shown in Tables 2 and 3.

Heat conductivity

A test piece having a thickness of about 1 mm was prepared and measured for heat dissipation coefficient by laser flash method, specific heat by DSC (differential scanning calorimetry) and density by Archimedes method. The heat conductivity of the test piece was calculated from a product of the three data obtained above.

Adhesion strength 1

Using one of the pastes obtained above, a square silicon chip of 2 mm×2 mm was bonded to a silver-plated copper frame; then, the paste was cured at 175° C. for 60 minutes. The cured paste was measured for shear strength at room temperature or at 250° C. by use of a push-pull gauge or a tension gauge.

Adhesion strength 2

Using one of the pastes obtained above, a square silicon chip of 9 mm×9 mm was bonded to a silver-plated copper frame; then, the paste was cured at 175° C. for 60 minutes. The cured paste was measured for peeling strength at 250° C. by use of a push-pull gauge.

Warpage

Using one of the pastes obtained above, a silicon chip of 15 mm×6 mm×0.3 mm (thickness) was bonded to a silver plated-copper frame having a thickness of 200 μm; then, the paste was cured at 175° C. for 60 minutes. The maximum vertical displacement of the chip in its longitudinal direction was determined as a yardstick of the low stress of the cured paste, by use of a surface roughness tester.

TABLE 2

|  |  | Unit | Example 1 | Example 2 | Example 3 | Example 4 | Example 5 |
|---|---|---|---|---|---|---|---|
| Composition (parts by weight) | Melt mixture 1 |  | 120 |  |  | 120 | 120 |
|  | Melt mixture 2 |  |  | 120 |  |  |  |
|  | Melt mixture 3 |  |  |  | 55 |  |  |
|  | Epoxy resin A |  |  |  | 65 |  |  |
|  | Dicyandiamide |  | 1 | 1 | 1 | 1 | 1 |
|  | 2P4MI |  | 0.3 | 0.3 | 0.3 | 0.3 | 0.3 |
|  | Coupling agent* |  | 1 | 1 | 1 | 1 | 1 |
|  | Silver powder A |  | 360 | 360 | 360 | 420 | 420 |
|  | Silver powder B |  | 120 | 120 | 120 | 60 |  |
|  | Silver powder C |  |  |  |  |  | 60 |
| Properties | Adhesion strength 1 (room temp.) | gf/chip | 5600 | 5100 | 5300 | 5500 | 5600 |
|  | Adhesion strength 1 (250° C.) | gf/chip | 1250 | 1050 | 1200 | 1300 | 1200 |
|  | Adhesion strength 2 (250° C.) | gf/chip | 480 | 420 | 450 | 490 | 460 |
|  | Warpage | μm | 70 | 65 | 80 | 62 | 56 |
|  | Heat conductivity | w/m · k | 2.9 | 2.7 | 2.8 | 3.2 | 3.2 |

*Coupling agent: γ-glycidoxypropyltrimethoxysilane

TABLE 3

|  |  | Unit | Comparative Example 1 | Comparative Example 2 | Comparative Example 3 | Comparative Example 4 | Comparative Example 5 |
|---|---|---|---|---|---|---|---|
| Composition (parts by weight) | Melt mixture 1 |  | 120 | 120 | 120 |  |  |
|  | Epoxy resin A |  |  |  |  | 65 | 65 |
|  | BPGE |  |  |  |  | 35 | 35 |
|  | THPE |  |  |  |  | 20 | 10 |
|  | Phenolic resin |  |  |  |  |  | 10 |
|  | Dicyandiamide |  | 1 | 1 | 1 | 1 | 1 |
|  | 2P4MI |  | 0.3 | 0.3 | 0.3 | 0.3 | 0.3 |
|  | Butyl cellosolve acetate |  | 5 | 5 | 5 | 5 | 5 |
|  | Coupling agent* |  | 1 | 1 | 1 | 1 | 1 |
|  | Silver powder A |  |  |  | 60 | 360 | 360 |
|  | Silver powder B |  | 480 |  | 420 | 120 | 120 |
|  | Silver powder C |  |  | 480 |  |  |  |
| Properties | Adhesion strength 1 (room temp.) | gf/chip | 5800 | 5300 | 5700 | 5400 | 5600 |
|  | Adhesion strength 1 (250° C.) | gf/chip | 1150 | 1250 | 1250 | 1050 | 1350 |
|  | Adhesion strength 2 (250° C.) | gf/chip | 460 | 480 | 480 | 430 | 300 |
|  | Warpage | μm | 70 | 72 | 75 | 70 | 110 |
|  | Heat conductivity | w/m · k | 2.0 | 1.8 | 2.2 | 1.8 | 2.1 |

*Coupling agent: γ-glycidoxypropyltrimethoxysilane

As clear from Tables 2 and 3, in each of Examples of the present invention employing a combination of a special silver powder and a special method for paste production, high heat conductivity is obtained and, further, high adhesion strength when hot and low stress (small warpage) are maintained. Meanwhile, in Comparative Examples employing only a special silver powder (this is one feature of the present invention) or only a melt mixture (this is also one feature of the present invention), no sufficient heat conductivity is obtained.

I claim:

1. A heat-conductive paste comprising
   (A) an epoxy resin which is liquid at room temperature and which has at least two epoxy groups in the molecule,
   (B) an epoxy group-containing reactive diluent having a viscosity of 100 cp or less at room temperature,
   (C) a phenolic compound as a curing agent represented by the following general formula (1), which is crystalline at room temperature:

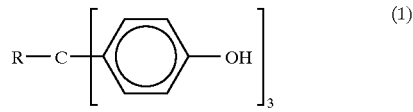  (1)

wherein R is hydrogen atom or an alkyl group of 1–5 carbon atoms, and
   (D) a silver powder,
wherein the amount of the silver powder (D) is 70–90% by weight of the total paste; the silver powder (D) contains an atomized silver powder consisting of flake-shaped particles having longitudinal lengths ranging from $10\mu$ to $50\mu$ and thicknesses ranging from $1\mu$ to $5\mu$, in an amount of at least 30% by weight of the total silver powder; and the paste is produced by first melt-mixing the component (C) with the components (A) and (B) or with the component (B), and then kneading the resulting mixture with the component (D) or with the components (D) and (A).

2. A paste according to claim 1, wherein the epoxy resin (A) is a diglycidyl ether which is obtained by the reaction of bisphenol A, bisphenol F or phenol novolac with epichlorohydrin and which is liquid at room temperature.

3. A paste according to claim 1, wherein the epoxy resin (A) is at least one alicyclic epoxy selected from the group consisting of vinylcyclohexene dioxide, dicyclopentadiene oxide and alicyclic diepoxide-adipate.

4. A paste according to claim 1, wherein the reactive diluent (B) is at least one member selected from the group consisting of styrene oxide, ethylhexyl glycidyl ether, phenyl glycidyl ether, credyl glycidyl ether and butylphenyl glycidyl ether.

5. A paste according to claim 1, wherein the proportion of the phenolic compound (C) is 0.1–20% by weight of the total paste.

6. A paste according to claim 1, which further comprises, as a curing agent other than the phenolic compound (C), at least one member selected from the group consisting of hexahydrophthalic acid anhydride, methylhydrophthalic acid anhydride, nadic acid anhydride, novolac type phenolic resin, imidazole and dicyandiamide.

7. A paste according to claim 1, which further comprises at least one additive selected from the group consisting of a curing accelerator, an antifoaming agent and a coupling agent.

* * * * *